(12) United States Patent
Sanchez et al.

(10) Patent No.: US 7,545,650 B2
(45) Date of Patent: Jun. 9, 2009

(54) SYSTEMS FOR RETAINING EXPANSION CARDS

(75) Inventors: Anthony Sanchez, Round Rock, TX (US); Corey Hartman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/469,485

(22) Filed: Sep. 1, 2006

(65) Prior Publication Data
US 2008/0055871 A1    Mar. 6, 2008

(51) Int. Cl.
*H05K 5/00* (2006.01)
(52) U.S. Cl. .................. 361/759; 361/801; 361/825; 361/826
(58) Field of Classification Search ......... 361/800–803, 361/686, 730, 755, 756, 759, 679, 747, 736; 312/223; 439/55, 61, 345, 350
See application file for complete search history.

(56) References Cited

U.S. PATENT DOCUMENTS

| | | | |
|---|---|---|---|
| 5,575,546 A | 11/1996 | Radloff | |
| 5,743,497 A * | 4/1998 | Michael | 248/68.1 |
| 5,748,453 A | 5/1998 | Carney et al. | |
| 5,982,627 A * | 11/1999 | Haughton et al. | 361/759 |
| 6,174,189 B1 * | 1/2001 | Kuo et al. | 439/327 |
| 6,278,614 B1 | 8/2001 | Beaman et al. | |
| 6,288,911 B1 | 9/2001 | Aoki et al. | |
| 6,396,685 B1 * | 5/2002 | Chien | 361/683 |
| 6,425,778 B1 | 7/2002 | Haq et al. | |
| 6,608,765 B2 | 8/2003 | Vier et al. | |
| 6,618,263 B1 | 9/2003 | Kin-Wing et al. | |
| 6,639,807 B1 | 10/2003 | Carney et al. | |
| 6,671,181 B2 | 12/2003 | Kaminski | |
| 6,775,147 B2 | 8/2004 | Kim et al. | |
| 6,870,744 B2 * | 3/2005 | Kosugi et al. | 361/801 |
| 6,881,089 B1 * | 4/2005 | Yang | 439/377 |
| 6,934,161 B2 | 8/2005 | Kim et al. | |
| 7,012,813 B2 | 3/2006 | Wang et al. | |
| 7,310,241 B2 * | 12/2007 | Peng et al. | 361/801 |
| 2003/0016496 A1 | 1/2003 | Kim et al. | |
| 2004/0109297 A1 | 6/2004 | Kim et al. | |
| 2004/0174687 A1 | 9/2004 | Wang et al. | |

* cited by examiner

*Primary Examiner*—Hung S Bui
(74) *Attorney, Agent, or Firm*—Pramudji Wendt & Tran, LLP

(57) ABSTRACT

An apparatus comprising a chassis defining an attachment slot suitable for receiving a first end of an expansion card and a bracket coupled to the chassis, the bracket movable into engagement with the expansion card closer to a second end than the first end when the expansion card is positioned in the attachment slot.

16 Claims, 3 Drawing Sheets

SYSTEMS FOR RETAINING EXPANSION CARDS

BACKGROUND

1. Technical Field

The present disclosure relates to information handling systems and particularly to the retention of expansion cards.

2. Background Information

As the value and use of information continues to increase, individuals and businesses seek additional ways to process and store information. One option available to users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

The following presents a general summary of some of the many possible embodiments of this disclosure in order to provide a basic understanding of this disclosure. This summary is not an extensive overview of all embodiments of the disclosure. This summary is not intended to identify key or critical elements of the disclosure or to delineate or otherwise limit the scope of the claims. The following summary merely presents some concepts of the disclosure in a general form as a prelude to the more detailed description that follows.

According to one embodiment, there is provided an apparatus comprising a chassis defining an attachment slot suitable for receiving a first end of an expansion card and a bracket coupled to the chassis, the bracket movable into engagement with the expansion card closer to a second end than the first end when the expansion card is positioned in the attachment slot.

According to another embodiment of the present disclosure, there is provided an apparatus comprising a chassis defining an attachment slot suitable for receiving an expansion card. The apparatus also comprises a bracket coupled to the chassis and movable into engagement with the expansion card when the card is positioned in the attachment slot, the bracket further comprising a stop and a spring.

According to even another embodiment, there is provided an information handling system comprising a chassis positioned in an interior of the information handling system, the chassis defining an attachment slot suitable for receiving a first end of an expansion card. The system also comprises a bracket further comprising a stop and a spring, the bracket coupled to the chassis and movable into engagement with the expansion card closer to a second end than the first end when the expansion card is positioned in the attachment slot.

According to another embodiment, there is provided a method for retaining an expansion card comprising positioning a first end of an expansion card in an attachment slot of a chassis and selectively coupling a bracket to the chassis, wherein the bracket secures the expansion card in the chassis by contacting the expansion card closer to a second end than the first end.

BRIEF DESCRIPTION OF THE DRAWINGS

The following drawings illustrate some of the many possible embodiments of this disclosure in order to provide a basic understanding of this disclosure. These drawings do not provide an extensive overview of all embodiments of this disclosure. These drawings are not intended to identify key or critical elements of the disclosure or to delineate or otherwise limit the scope of the claims. The following drawings merely present some concepts of the disclosure in a general form. Thus, for a detailed understanding of this disclosure, reference should be made to the following detailed description, taken in conjunction with the accompanying drawings, in which like elements have been given like numerals.

DETAILED DESCRIPTION

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

An IHS may also include a component such as an expansion card, which may also be called an expansion board, adapter, add-in or add-on. Non-limiting examples of expansion cards include modem, fax cards, communication cards, graphics cards, sound cards and other input/output (I/O) devices. An expansion card may be inserted into an expansion slot in the information handling system to enhance the capabilities and functionality of the system. Expansion slot standards may include Accelerated Graphics Port (AGP), Industry Standard Architecture (ISA), Peripheral Component Interconnect (PCI) and PCI Express.

If an information handling system is moved or shipped to another location, it may experience vibrations or external shock from impact loads which may cause an expansion card to become loosened causing the card to not function with the IHS. Therefore, an expansion card should be retained or secured in position within an IHS. The present disclosure relates to apparatus, systems and methods for retaining expansion cards.

Figure 1:
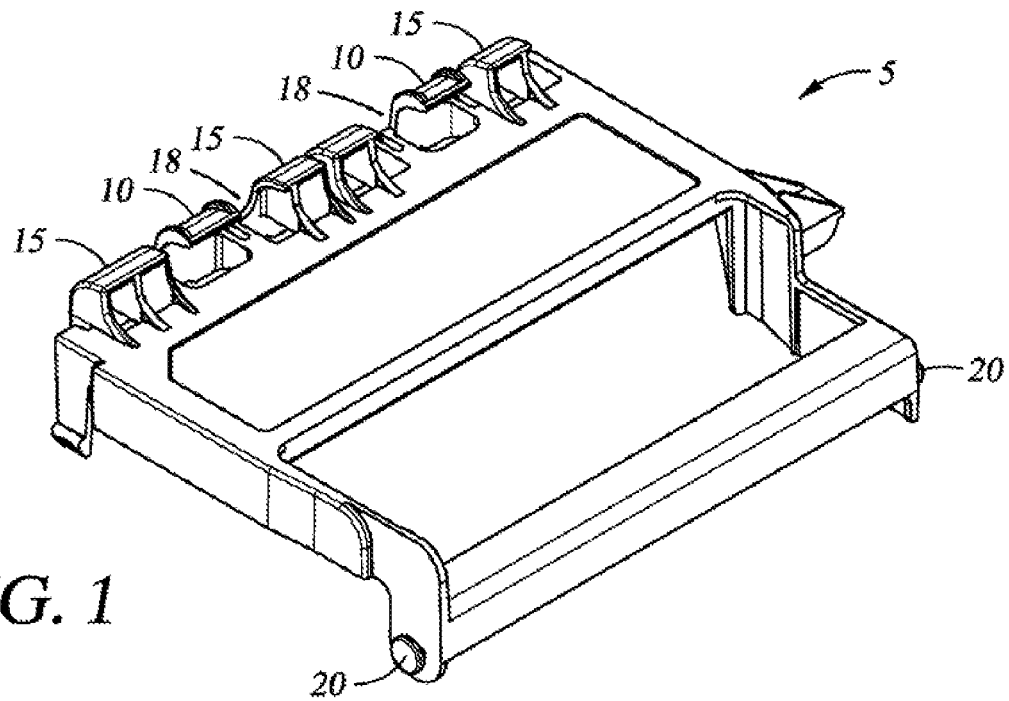
FIG. 1 is a non-limiting isometric view from above a bracket for retaining an expansion card.
Figure 2:
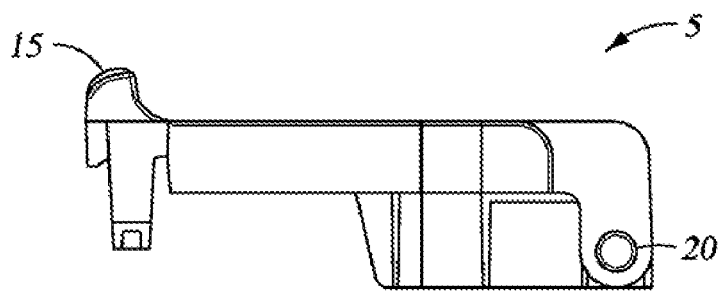
FIG. 2 is a non-limiting side view of the bracket of FIG. 1.
Figure 3:
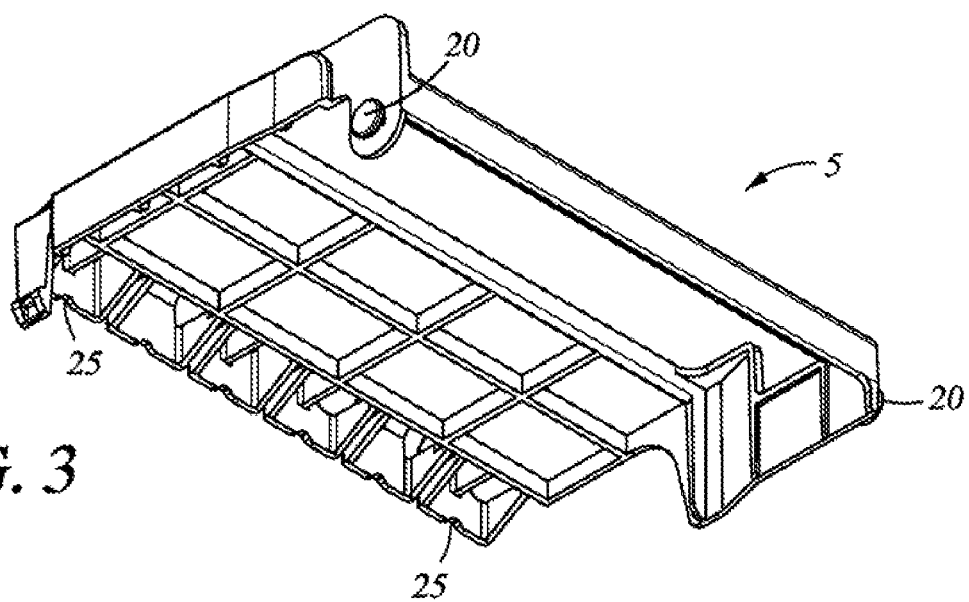
FIG. 3 is a non-limiting isometric view from below the bracket of FIG. 1.

FIGS. 1, 2 and 3 are non-limiting views of a bracket 5 for retaining an expansion card. The bracket 5 may include at least one spring 10 and at least one stop 15. The spring 10 and the stop 15 are configured to engage the enclosure of an information handling system with the spring 10 providing resilience against the enclosure while the stop 15 defines the nearest approach of the bracket 5 and the enclosure. While they may be located anywhere on the bracket 5 as desired for any particular application or design, in the non-limiting embodiment as shown, the spring 10 and the stop 15 are members located along the same edge of the bracket 5. The spring 10 and the stop 15 are components of the bracket 5 for a number of reasons, including to reduce and/or eliminate movement of the bracket 5 and to reduce and/or eliminate vibration of an expansion card when the card is in contact with the bracket 5. The spring 10 and the stop 15 may be stand alone items added to the bracket 5, or as in the non-limiting embodiment as shown, may constitute one piece with the bracket 5. In the non-limiting embodiment as shown, four stops and two springs are disposed on bracket 5. However, it is recognized that the bracket 5 may consist of any number of stop or springs.

The spring 10 may be any member disposed on the bracket 5 that exhibits the characteristic of resilience or the ability to recover/recoil from an external shock. As shown in one embodiment, the spring 10 may take the form of a curved, protruding member disposed on one edge of the bracket 5. However, it is well understood that the spring 10 may take any form provided that it maintains or provide a resilient characteristic.

Alternatively, the stop 15 may be any member disposed on the bracket 5 that exhibits the characteristic of resistance or the ability to oppose, limit or reduce motion. As shown in one embodiment, the stop 15 may take the form of a protruding member disposed on one edge of the bracket 5. However, it is well recognized that the stop 15 may take any form provided that it is a type of resistant body.

One or more cable slots 18 are provided and suitably sized to receive one or more cables/wires. These cable slots 18 may be defined by the bracket 5, or as in the non-limiting embodiment as shown, the cable slots 18 may be defined by separations between the spring 10 and the stop 15.

The bracket 5 may include at least one hinge 20. The bracket 5 may be pivotally coupled to a chassis when a hinge 20 on the bracket 5 is in contact with a hinge slot of the chassis. The bracket 5 may also be constructed from plastic, although it is well understood that the bracket may be formed from other materials.

The bracket 5 may include a groove 25 to receive the edge of an expansion card. When the bracket 5 is pivoted into contact with an expansion card, the groove 25 receives an edge of the expansion card and may provide a bias against swaying of the expansion card during movement or shipment.

Figure 4:
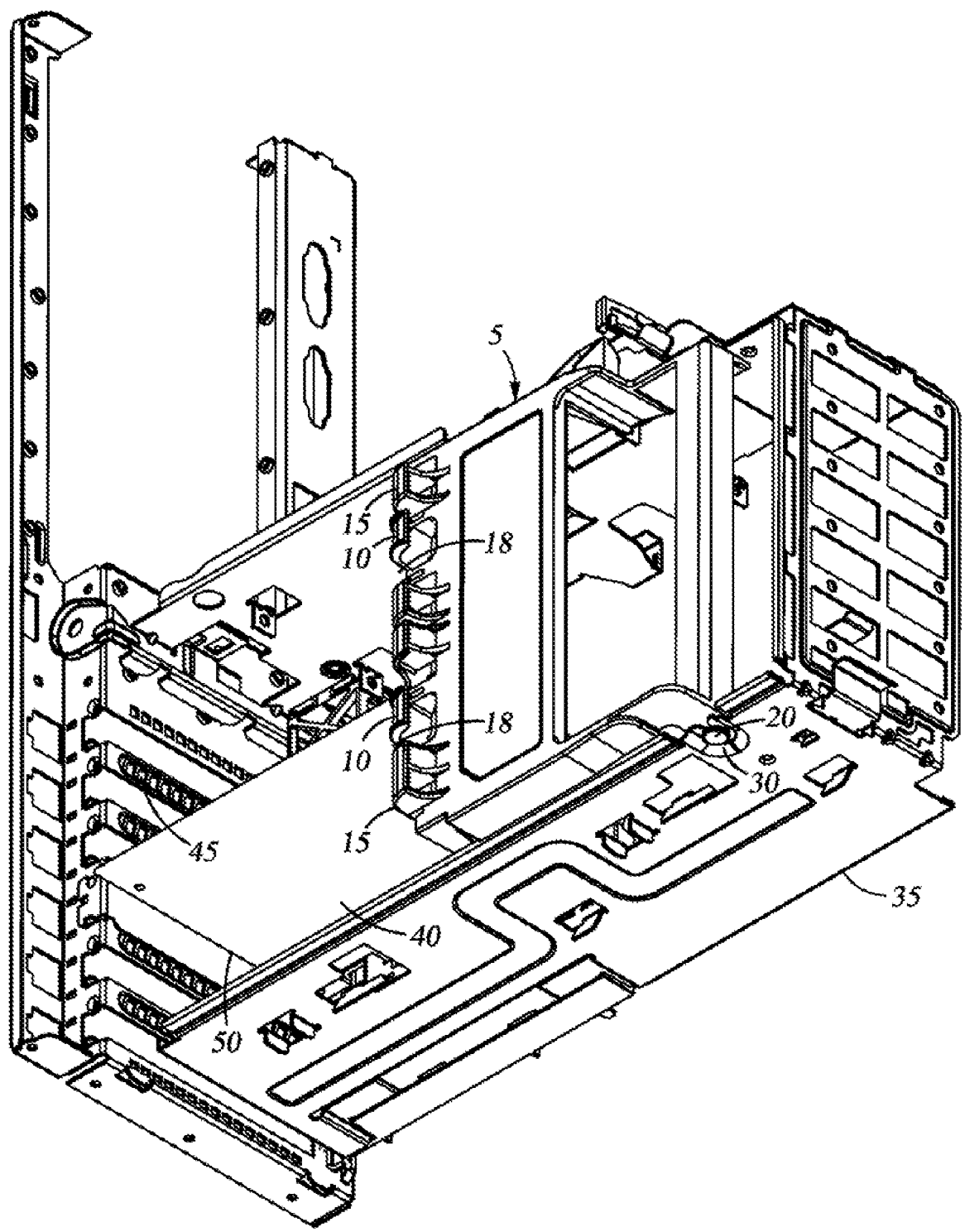
FIG. 4 is a non-limiting isometric view of a chassis coupled to a both an expansion card and the engaged bracket of FIG. 1.

FIG. 4 is a non-limiting view of a chassis 35 coupled to a both an expansion card 40 and an engaged bracket 5. When placed inside an IHS, the chassis 35 may become a portion or the entire framework or support structure onto which components such as a disk drive and motherboard are mounted. One end of the chassis 35 may define an attachment slot 45 which serves as a point of attachment for a first end 50 of an expansion card 40. The chassis 35 may also include a hinge slot 30 to be in contact with a hinge 20 of the bracket 5. The hinge slot 30 may be an opening or groove disposed on the chassis 35 to receive the hinge 20. In a non-limiting embodiment as shown, the hinge 20 with an elongated shaped axle (not shown) may be moved into a hinge slot 30, and once the bracket 5 is rotated into engagement with card 40, the bracket 5 is secured in place. It should be understood that any suitable type of pivoting fastener or hinge may be utilized to secure the bracket 5 to the chassis 35, provided that the bracket 5 is easily removable from a secured position with the chassis 35 and may be engaged with the expansion card 40.

Also, as illustrated in FIG. 4, the bracket 5 is in an engaged position when it is secured in the chassis 35 and in contact with an expansion card 40 with the card properly positioned in the attachment slot. When expansion cards of similar heights are attached to chassis 35, the bracket 5 applies roughly equal force on all cards, within the tolerance of the heights of the card and the uniformity of depth of the grooves 25. An enclosure of an IHS surrounding the chassis 35 may be in a contact with the spring 10 and the stop 15 of the bracket 5. The spring 10 and the stop 15 transfer impact loads (e.g., those which occur during movement, transportation or shipment of the IHS) from the edge of the expansion card 40 to the enclosure of an IHS.

Figure 5:
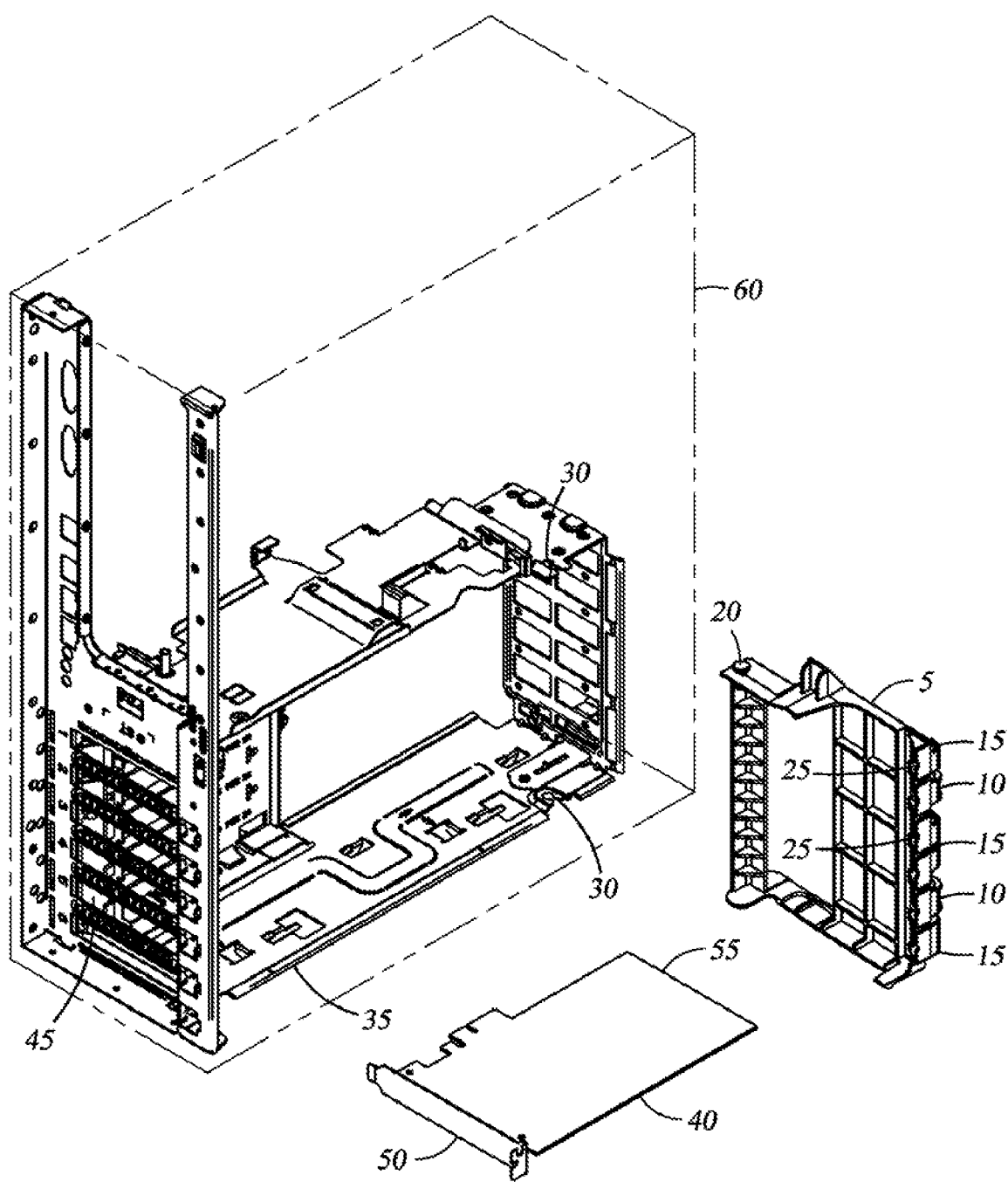
FIG. 5 is a non-limiting partially exploded perspective view of FIG. 4 showing a chassis with an unattached expansion card and the unengaged bracket of FIG. 1.

FIG. 5 is a partially exploded view of FIG. 4, showing the chassis 35 with an unattached expansion card 40 and an unengaged bracket 5. The chassis 35 as shown in FIG. 5 is mounted within an enclosure 60 of an IHS. The enclosure 60, which contains internal components of an IHS, may also be considered a cabinet, tower, box or housing. An expansion card 40 with a first end 50 and a second end 55 is shown unattached to the attachment slot 45 and removed from the chassis 35. As shown in FIG. 5, the bracket 5 is in an unengaged position, i.e., not in contact with an expansion card 40. Also, as seen in FIG. 5, the bracket 5 may be released or removed from the chassis 35 such that the hinge 20 is not in contact with a hinge slot 30. The bracket 5 may be removed from the chassis 35 in the event a card 40 is used which may possibly interfere with the bracket 5.

While various embodiments have been shown and described, various modifications and substitutions may be made thereto without departing from the spirit and scope of the invention. Accordingly, it is to be understood that the present invention has been described by way of illustrations and not limitation.

What is claimed is:

1. An apparatus comprising:
a chassis defining an attachment slot suitable for receiving a first end of an expansion card; and
a bracket coupled to the chassis, the bracket movable into engagement with the expansion card closer to a second end than the first end when the expansion card is positioned in the attachment slot, the bracket further defines a cable slot formed to receive a cable, wherein the bracket further comprises a stop and a spring to contact an enclosure of an information handling system when the bracket is in an engaged position.

2. The apparatus of claim 1, wherein the bracket is coupled to the chassis at an end opposite from the attachment slot.

3. The apparatus of claim 1, wherein the bracket comprises a hinge to pivotally engage a hinge slot on the chassis, the bracket being secured in the hinge slot when the bracket is in a first position and released out of the hinge slot when rotated to a second position.

4. The apparatus of claim 1, wherein the bracket defines a groove formed to receive the expansion card.

5. The apparatus of claim 1, wherein the bracket may be in an engaged position when the chassis is in a vertical position.

6. The apparatus of claim 1 further comprising the expansion card with the first end of the expansion card positioned in the attachment slot wherein the bracket engages the expansion card closer to a second end than the first end.

7. An apparatus comprising:
a chassis defining an attachment slot suitable for receiving an expansion card; and
a bracket coupled to the chassis and movable into engagement with the expansion card when the card is positioned in the attachment slot, the bracket further comprising a stop and a spring and the bracket defines a cable slot formed to receive a cable, and wherein the bracket further comprises a stop and a spring to contact an enclosure of an information handling system when the bracket is in an engaged position.

8. The apparatus of claim 7, wherein the bracket is coupled to the chassis at an end opposite from the attachment slot.

9. The apparatus of claim 7, wherein the bracket comprises a hinge to pivotally engage a hinge slot on the chassis, the bracket being secured in the hinge slot when the bracket is in a first position and released out of the hinge slot when rotated to a second position.

10. The apparatus of claim 7, wherein the bracket defines a groove formed to receive the expansion card.

11. The apparatus of claim 7, wherein the bracket may be in an engaged position when the chassis is in a vertical position.

12. An information handling system comprising:
a chassis positioned in an interior of the information handling system, the chassis defining an attachment slot suitable for receiving a first end of an expansion card; and
a bracket further comprising a stop and a spring, the bracket coupled to the chassis and movable into engagement with the expansion card closer to a second end than the first end when the expansion card is positioned in the attachment slot, the bracket further defines a cable slot formed to receive a cable and wherein the stop and the spring are in contact with an enclosure of the information handling system when the bracket is in an engaged position.

13. The system of claim 12, wherein the bracket is pivotally attached to the chassis at an end opposite from the attachment slots.

14. The system of claim 12, wherein the bracket comprises a hinge to pivotally engage a hinge slot on the chassis, the bracket being secured in the hinge slot when the bracket is in a first position and released out of the hinge slot when rotated to a second position.

15. The apparatus as claimed in claim 12, wherein the bracket defines a groove formed to receive an expansion card.

16. The apparatus as claimed in claim 12, wherein the bracket may be in an engaged position when the chassis is in a vertical position.

* * * * *